(12) United States Patent
Liebmann et al.

(10) Patent No.: US 12,002,862 B2
(45) Date of Patent: Jun. 4, 2024

(54) INTER-LEVEL HANDSHAKE FOR DENSE 3D LOGIC INTEGRATION

(71) Applicant: Tokyo Electron Limited, Tokyo (JP)

(72) Inventors: Lars Liebmann, Mechanicsville, NY (US); Jeffrey Smith, Clifton Park, NY (US); Daniel Chanemougame, Niskayuna, NY (US); Paul Gutwin, Williston, VT (US)

(73) Assignee: Tokyo Electron Limited, Tokyo (JP)

( * ) Notice: Subject to any disclaimer, the term of this patent is extended or adjusted under 35 U.S.C. 154(b) by 327 days.

(21) Appl. No.: 17/328,289

(22) Filed: May 24, 2021

(65) Prior Publication Data

US 2022/0181453 A1    Jun. 9, 2022

Related U.S. Application Data

(60) Provisional application No. 63/121,845, filed on Dec. 4, 2020.

(51) Int. Cl.
| | | |
|---|---|---|
| *H01L 29/786* | (2006.01) | |
| *H01L 27/06* | (2006.01) | |
| *H01L 27/092* | (2006.01) | |
| *H01L 29/06* | (2006.01) | |
| *H01L 29/417* | (2006.01) | |

(Continued)

(52) U.S. Cl.
CPC .... *H01L 29/41733* (2013.01); *H01L 27/0688* (2013.01); *H01L 27/092* (2013.01); *H01L 29/0665* (2013.01); *H01L 29/41783* (2013.01); *H01L 29/42392* (2013.01); *H01L 29/78621* (2013.01); *H10B 10/125* (2023.02); *H10B 10/18* (2023.02)

(58) Field of Classification Search
CPC ............ H01L 29/41733; H01L 27/688; H01L 27/092–0922; H01L 29/0665; H01L 29/41783; H01L 29/42392; H01L 29/78621; H10B 10/125; H10B 10/18
See application file for complete search history.

(56) References Cited

U.S. PATENT DOCUMENTS

| | | |
|---|---|---|
| 10,304,832 B1 | 5/2019 | Chanemougame et al. |
| 10,861,852 B2 | 12/2020 | Li et al. |
| 11,126,775 B2 | 9/2021 | Peng et al. |

(Continued)

OTHER PUBLICATIONS

International Search Report and Written Opinion of the International Searching Authority dated Feb. 21, 2022 in PCT/US2021/05457, 8 pages.

*Primary Examiner* — Suberr L Chi
*Assistant Examiner* — Carnell Hunter, III
(74) *Attorney, Agent, or Firm* — Oblon, McClelland, Maier & Neustadt, L.L.P.

(57) ABSTRACT

A semiconductor device includes a first device plane over a substrate. The first device plane includes a first transistor device having a first source/drain (S/D) region formed in an S/D channel. A second device plane is formed over the first device plane. The second device plane includes a second transistor device having a second gate formed in a gate channel which is adjacent to the S/D channel. A first inter-level connection is formed from the first S/D region of the first transistor device to the second gate of the second transistor device. The first inter-level connection includes a lateral offset from the S/D channel to the gate channel.

16 Claims, 7 Drawing Sheets

(51) Int. Cl.
*H01L 29/423* (2006.01)
*H10B 10/00* (2023.01)

(56) References Cited

U.S. PATENT DOCUMENTS

| | | |
|---|---|---|
| 11,158,544 B2 | 10/2021 | Cheng et al. |
| 2019/0148376 A1 | 5/2019 | Chanemougame et al. |
| 2020/0075592 A1 | 3/2020 | Liebmann et al. |
| 2020/0111798 A1* | 4/2020 | Paul ................ H01L 21/76843 |
| 2020/0144264 A1 | 5/2020 | Li et al. |
| 2020/0294866 A1 | 9/2020 | Cheng et al. |
| 2020/0327273 A1 | 10/2020 | Peng et al. |
| 2021/0374315 A1 | 12/2021 | Peng et al. |

* cited by examiner

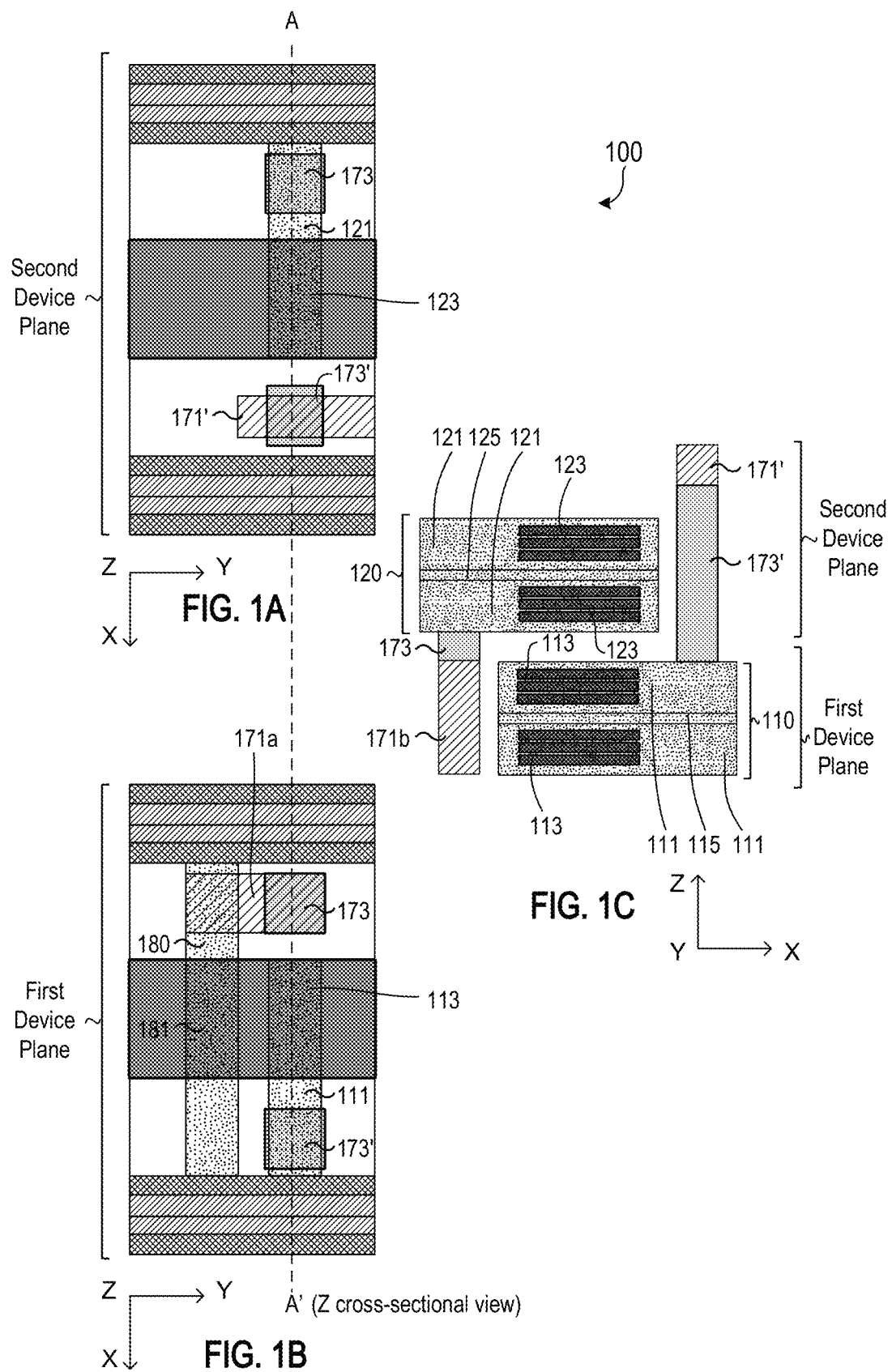

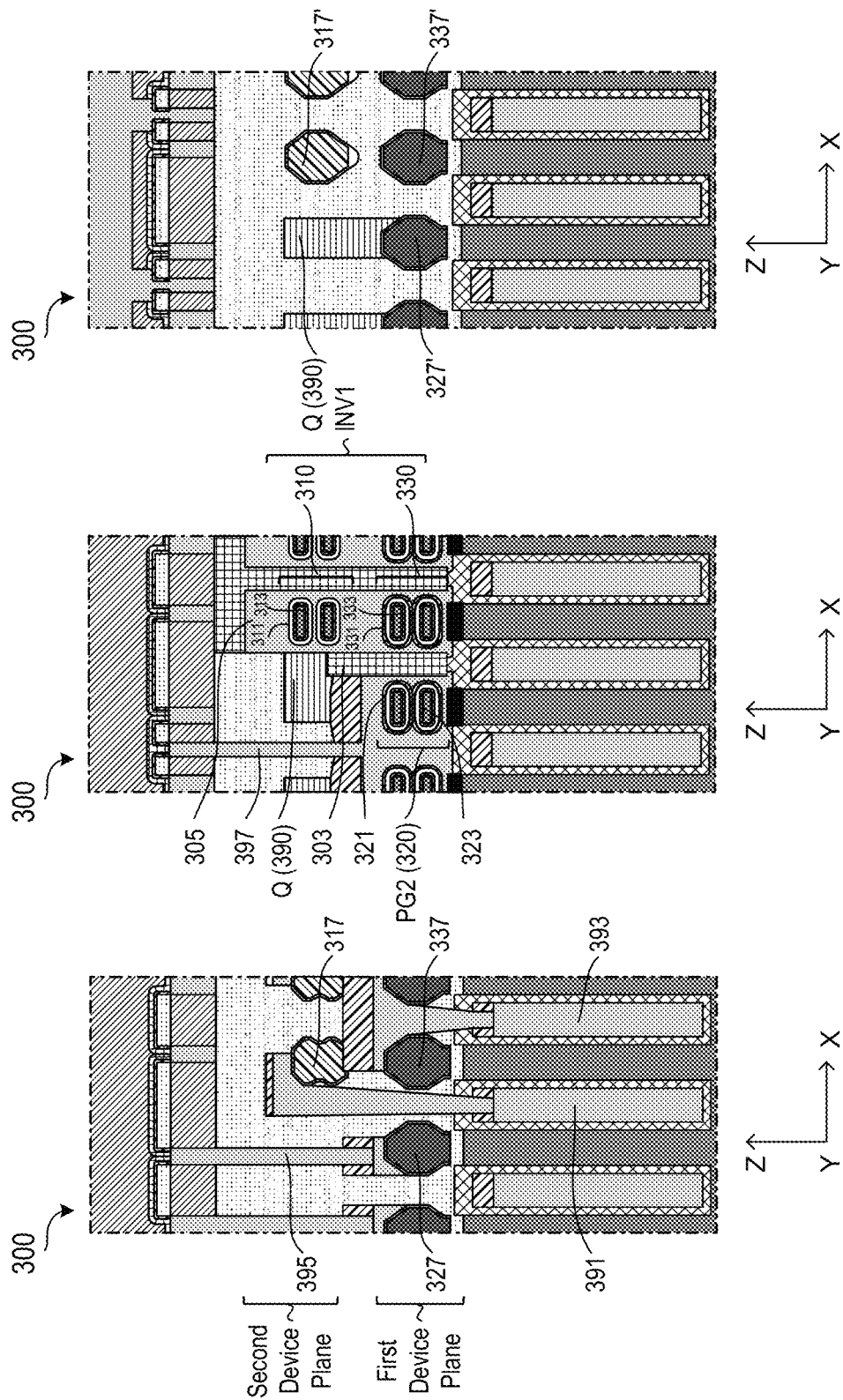

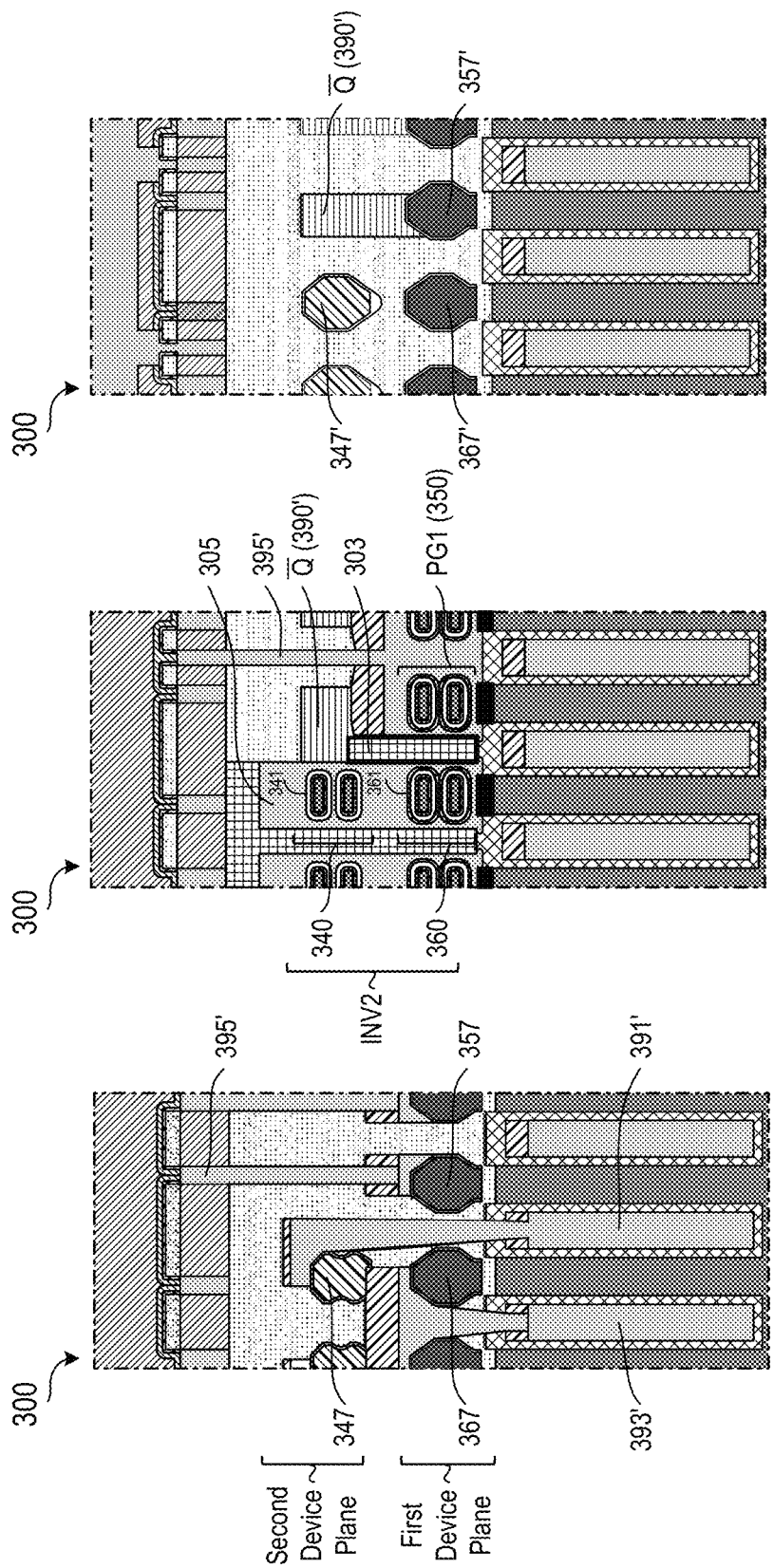

INTER-LEVEL HANDSHAKE FOR DENSE 3D LOGIC INTEGRATION

INCORPORATION BY REFERENCE

This present disclosure claims the benefit of U.S. Provisional Application No. 63/121,845, filed on Dec. 4, 2020, the entire content of which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device.

An aspect (1) includes a semiconductor device. The semiconductor device includes a first device plane over a substrate. The first device plane includes a first transistor device having a first source/drain (S/D) region formed in an S/D channel. A second device plane is formed over the first device plane. The second device plane includes a second transistor device having a second gate formed in a gate channel which is adjacent to the S/D channel. A first inter-level connection is formed from the first S/D region of the first transistor device to the second gate of the second transistor device. The first inter-level connection includes a lateral offset from the S/D channel to the gate channel.

An aspect (2) includes the semiconductor device of aspect (1), wherein the first inter-level connection includes the S/D channel, a horizontal portion that contacts the S/D channel, and a vertical portion that connects the horizontal portion to the second gate.

An aspect (3) includes the semiconductor device of aspect (2), wherein the horizontal portion corresponds to the lateral offset.

An aspect (4) includes the semiconductor device of aspect (2), wherein the vertical portion extends from the first device plane to the second device plane and corresponds to a vertical distance from the first S/D region to the second gate relative to a surface of the substrate An aspect (5) includes the semiconductor device of aspect (2), wherein the first inter-level connection has an L shape in a horizontal cross section parallel to a surface of the substrate.

An aspect (6) includes the semiconductor device of aspect (1), wherein the first inter-level connection includes a conductive metal wiring structure.

An aspect (7) includes the semiconductor device of aspect (1), wherein the first transistor device is configured to provide an input signal to the second transistor device.

An aspect (8) includes the semiconductor device of aspect (1), further including a second inter-level connection that connects a first gate of the first transistor device to a second S/D region in the second device plane.

An aspect (9) includes the semiconductor device of aspect (8), wherein the second S/D region is part of the second transistor device in the second device plane.

An aspect (10) includes the semiconductor device of aspect (8), wherein the second S/D region is part of a third transistor device in the second device plane.

An aspect (11) includes the semiconductor device of aspect (1), wherein the first transistor device and the second transistor device are both complementary field-effect transistors (CFETs).

An aspect (12) includes the semiconductor device of aspect (1), wherein the first transistor device is an n-type field-effect transistor (FET). The second transistor device is a p-type FET, and the first device plane further includes another n-type FET so as to form a CFET with the second transistor device.

According to an aspect (13) of the disclosure, a semiconductor device is provided. The semiconductor device includes a pair of CFETs formed over a substrate. The pair of CFETs includes an upper CFET positioned over a lower CFET. Each CFET includes a p-type FET and an n-type FET positioned over each other resulting in a vertical stack of at least four FETs relative to a surface of the substrate. The upper CFET includes an upper pair of complementary gates. The lower CFET includes a lower pair of complementary gates positioned below the upper pair of complementary gates. An inter-level connection is formed from a pair of complementary gates formed in a gate channel of one CFET to an S/D region formed in an S/D channel of the other CFET. The gate channel of one CFET has a lateral offset from the S/D channel of the other CFET in a horizontal direction along the surface of the substrate and a vertical distance from the S/D channel of the other CFET in a vertical direction relative to the surface of the substrate.

An aspect (14) includes the semiconductor device of aspect (13), wherein the inter-level connection includes the S/D channel, a horizontal portion that is connected to the S/D channel and corresponds to the lateral offset, and a vertical portion that connects the horizontal portion to the gate channel and corresponds to the vertical distance.

An aspect (15) includes the semiconductor device of aspect (13), wherein a gate occupies a respective channel being recessed.

An aspect (16) includes the semiconductor device of aspect (13), wherein the inter-level connection is formed from the upper pair of complementary gates of the upper CFET to a lower S/D region of the lower CFET. The semiconductor device further includes a self-aligned contact that connects the upper pair of complementary gates to one or more structures positioned below the upper pair of complementary gates.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIGS. 1A and 1B show layout diagrams of two device planes of a semiconductor device, in accordance with an embodiment of the disclosure.

FIG. 1C shows a cross-sectional view taken along the line cut AA' in FIGS. 1A and 1B, in accordance with some embodiments of the disclosure.

FIGS. 3E, 3F, and 3G show cross-sectional views taken along line cuts EE', FF', and GG' in FIG. 3C, respectively, in accordance with some embodiments of the disclosure.

FIGS. 3H, 3I, and 3J show cross-sectional views taken along line cuts HH', II', and JJ' in FIG. 3D, respectively, in accordance with some embodiments of the disclosure.

DETAILED DESCRIPTION

Figure 1D:
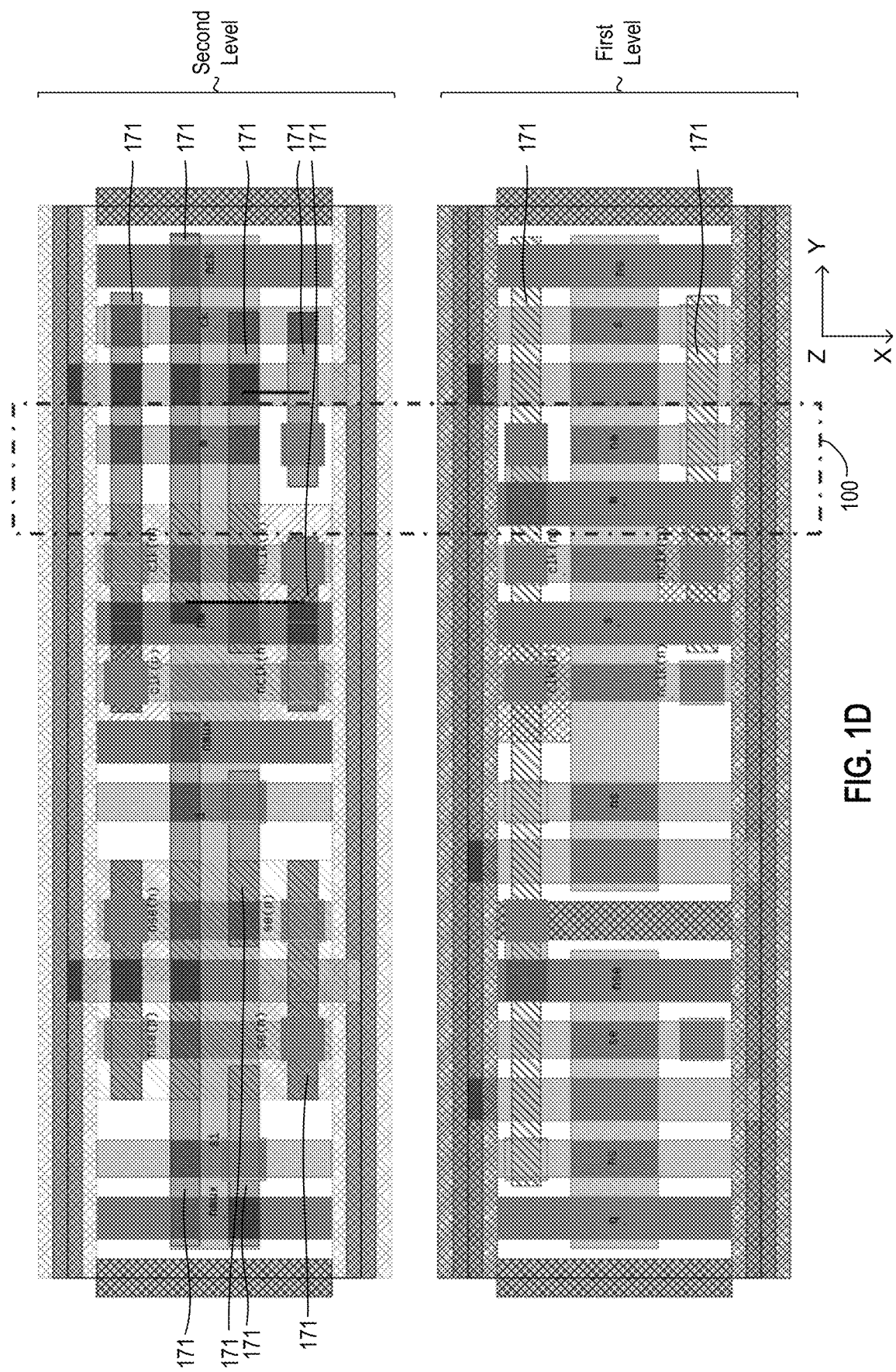
FIG. 1D shows a layout for a transistor placement, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein include a novel construct and the associated process integration solution that enables efficient and compact integration of transistors into dense 3D logic functions. 3D integration, i.e., the vertical stacking of multiple devices, aims to overcome scaling limitations experienced in conventional two dimensional very large-scale integration (VLSI) by increasing the transistor density in volume rather than area. The particular 3D integration (3Di) solution here is particularly applicable to transistor-on-transistor (ToT) 3Di. In ToT 3Di, multiple field-effect transistors (FET) are stacked vertically on top of each other. For example, the most basic form of ToT 3Di is the complementary FET (CFET) in which complementary pairs of n-type and p-type transistors are stacked either monolithically or sequentially. The ToT 3Di approach herein expands this concept and stacks two sets of CFET on top of each other.

CFET improves transistor density in standard cell logic designs by reducing the height of the standard cell, effectively by folding the "p half" of the standard cell over (on top of) the "n half." Note that when considering a cell layout from a top view, the term "height" refers to a lateral dimension of the cell layout. Stacked CFET further improves transistor density by reducing the width of the standard cell by effectively folding the cell left-over-right. A well-known challenge in ToT 3Di is the increased wiring congestion caused by having to connect the same number of input and output signals as well as internal signal in a substantially reduced footprint area.

Techniques herein include devices and methods for 3D integration. Embodiments include designs and associated integration solutions to facilitate critical connections in stacked CFET 3Di while minimizing the impact on sparse wiring resources.

Many signal paths in combinatorial as well as sequential logic cells involve taking the output of one transistor and making it the signal for another transistor (e.g., the typical output inverter takes the output of one or several logic operations and uses this signal to switch the gate of the final inverter) or vice versa (e.g., an input inverter). Structurally, this connection requires a source/drain (S/D) local interconnect (LI) to be connected to a gate. In conventional 2D logic implementations, this is accomplished by connecting the source/drain through LI to the lowest level of metal (M0), running M0 to the desired gate, and dropping a contact. In 2D logic, this is necessary because the two transistors requiring the source/drain to gate connection are typically separated by several other devices. Moreover, in 2D logic this is fairly easily accomplished because wire congestion (while challenging) is mostly manageable. In dense ToT 3Di, smart transistor placement can bring the transistors requiring the source/drain to gate connection in close lateral proximity though vertically separated. Designs and methods herein facilitate a dense layout by providing a means of connecting a source/drain region on one level with a gate input on the other level.

A semi-dynamic flip-flop (SDFF) is a very commonly used and highly dense sensitive logic cell. Techniques herein include a source/drain to gate connection enabled by the disclosed "inter-level handshake." FIG. 1D shows a layout for a transistor placement. In FIG. 1D, two levels of CFET design (e.g., a first level and a second level) are shown as separate layouts. As the density of wiring structures 171 indicates, and as mentioned above, wiring congestion is a major challenge for dense ToT 3Di. To prevent this wiring congestion from impacting area scaling, it is highly desirable to take advantage of the lateral proximity of transistors needing to be connected by enabling a direct inter-level source/drain to gate connection as one embodiment illustrated in FIGS. 1A-1C does. Herein, FIGS. 1A-1C show a semiconductor device 100 including a stacked pair of cross-couples framed by dashed lines in FIG. 1D.

In FIGS. 1A and 1B, two device planes (e.g., two levels of CFET design) of a semiconductor device 100 are shown as separate layouts. FIG. 1C shows a cross-sectional view (e.g., a cross section of the transistor stack) taken along the line cut AA' in FIGS. 1A and 1B. As shown, a first device plane (e.g., a bottom level) is located below a second device plane (e.g., a top level). In a non-limiting example, the first device plane includes a first transistor device 110 that has a first source/drain (S/D) local interconnect (LI) structure 180 (also referred to as a first S/D channel or a first S/D LI channel). The first S/D LI structure 180 is connected to a first S/D region 181 in the first device plane. The second device plane includes a second transistor device 120 that has a second gate 121 that is positioned above the first S/D LI structure 180 and has a lateral offset from the first S/D LI structure 180 in a horizontal direction along a surface of a substrate (in the XY plane).

Note that in this embodiment, the first transistor device 110 and the second transistor device 120 are both CFETs. In a non-limiting example, the first transistor device 110 includes a p-type FET device over an n-type FET device while the second transistor device 120 includes an n-type FET device over a p-type FET device. Accordingly, each transistor device (e.g., 120) includes a pair of complementary gates (e.g., 121) that surround respective channel regions (e.g., 123). The first transistor device 110 and the second transistor device 120 each include three channel regions 123 in this example and may include any number of channel regions in other embodiments. Further, each pair of complementary gates (e.g., 121) is connected together by a strap structure (e.g., 125).

The semiconductor device 100 further includes a first inter-level connection from the second gate 121 to the first S/D region 181. Consequently, the first transistor device 110 is configured to provide an input signal to the second transistor device 120 through the first inter-level connection. Specifically, the first inter-level connection includes the first S/D LI structure 180, a first conductive metal wiring structure (e.g., 171a and 171b), and a first self-aligned contact 173. The first conductive metal wiring structure (e.g., 171a) contacts the first S/D LI structure 180, and the first self-aligned contact 173 contacts the second gate 121. As has been mentioned before, the second gate 121 has the lateral offset from the first S/D LI structure 180 in the XY plane. Accordingly, the first inter-level connection includes a horizontal portion 171a that corresponds to the lateral offset. The horizontal portion 171a is part of the first conductive metal wiring structure in this example. The first inter-level connection also includes a vertical portion 171b that extends from the first device plane to the second device plane and corresponds to a vertical distance from the first S/D LI structure 180 to the second gate 121 in the Z direction. As seen in FIG. 1B, the lower level portion of the first inter-level connection has an L shape in a horizontal cross section parallel to the surface of the substrate (in the XY plane). In an alternative embodiment, the first inter-level connection may form a different conductive path to connect the second gate 121 to the first S/D region 181.

In some embodiments, the semiconductor device 100 further includes a second inter-level connection. In the example of FIGS. 1A-1C, a second self-contact 173' connects a first gate 111 of the first transistor 110 to a second conductive metal wiring structure 171' that further contacts a second S/D LI structure (not shown) in the second device plane. Note that different from the first inter-level connection, the second inter-level connection includes a horizontal portion that includes the second conductive metal wiring structure 171' and a vertical portion that includes the second self-aligned contact 173'. In one embodiment, the second S/D LI structure is connected to a second S/D region of the second transistor device 120 in the second device plane so that the second transistor device 120 is configured to provide an input signal to the first transistor device 110. In another embodiment, the second S/D LI structure is connected to a third S/D region of a third transistor device (not shown) in the second device plane so that the third transistor device is configured to provide an input signal to the first transistor device 110.

Figure 2:
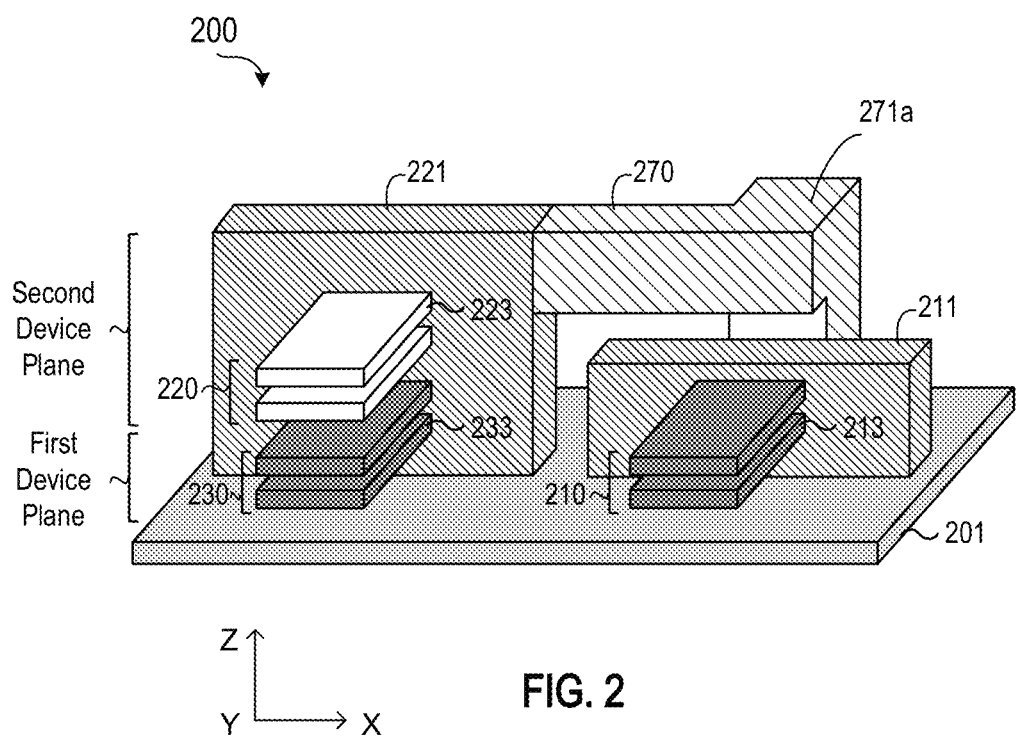
FIG. 2 shows a three-dimensional view of a semiconductor device, in accordance with another embodiment of the disclosure.

FIGS. 1A-1C show a detailed view of an inter-level handshake, such as the first inter-level connection. Features herein include a lateral offset from a source/drain local interconnect channel on one level to a neighboring gate channel on another level. Typically these two conductive paths (e.g., the first S/D LI structure 180 and the second gate 121) run in parallel and are very deliberately isolated from each other to provide self-alignment. While FIGS. 1A-1C show an embodiment where the first transistor device 110 and the second transistor device 120 are both CFETs, FIG. 2 shows another embodiment where a first transistor device 210 is a single FET and a second transistor device 220 is another FET.

In a non-limiting example, the first transistor device 210 and the second transistor device 220 are a p-type FET and an n-type FET, respectively. A second gate 221 of the second transistor device 220 is connected to a first S/D region (not shown) of the first transistor device 210 by an inter-level connection 270 that corresponds to the first inter-level connection in FIGS. 1A-1C. As shown, the first device plane further includes a third transistor device 230 that is another n-type FET so that the second transistor device 220 and the third transistor device 230 form a CFET over a substrate 201. Accordingly, the second gate 221 can function as a common gate for both the first transistor device 210 and the third transistor device 230. In this example, each transistor device has two nanosheet channels (e.g., 213, 223, and 233). It should be understood that any number of channels can be formed to meet specific design requirements. In the embodiment of FIG. 2, the first S/D region of the first transistor device 210 is hidden from view by the gate structure 211. A lateral offset 271a connects the gate channel or track to an S/D track to provide the inter-level handshake.

The most fundamental unit structure of SRAM memory is a bit cell. A construct typically reserved for SRAM bit cell's cross-couples, as illustrated in FIGS. 3A-3J, is used to implement this lateral conductive path (i.e., the inter-level connection 270) shown in FIG. 2. A gate trim process herein enables the end of a bottom gate to be recessed underneath the top gate. See U.S. Provisional application No. 63/121, 597 filed on Dec. 4, 2020 for details, which is incorporated herein by reference. Also see U.S. Ser. No. 63/085,568, filed on Sep. 30, 2020, for more details, which is also incorporated herein by reference. A self-aligned contact connects the top gate to structures below. The integration scheme for this contact follows a current M0 self-aligned contact flow but is formed during top gate metallization.

Figure 3A:
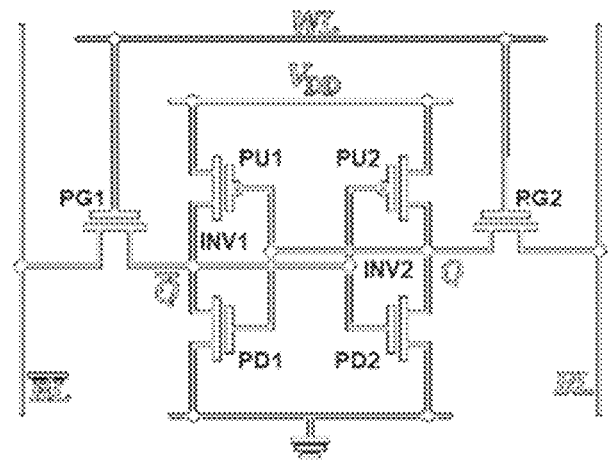
FIG. 3A shows a circuit diagram of a SRAM bit cell, in accordance with some embodiments of the disclosure.

FIG. 3A shows a circuit diagram of a SRAM bit cell. As is well known by one skilled in the art, an SRAM bit cell is typically made of six transistors: four n-type metal-oxide-semiconductors (NMOS) and two p-type metal-oxide-semiconductors (PMOS) (6T bit cell). The six transistors are connected to form two inverters (PMOS and NMOS sharing a common gate) that are latched together. In the FIG. 3A example, two PMOS are called pull-up (PU) (e.g., PU1 and PU2). Two NMOS are called pull-down (PD) (e.g., PD1 and PD2). The other two NMOS are called pass-gate (PG) (e.g., PG1 and PG2). PU1 and PD1 form a CFET inverter, INV1 while PU2 and PD2 form another CFET inverter, INV2. An output of INV1, Q is connected to an input of INV2, and an output of INV2, $\overline{Q}$ is connected to an input of INV1. Q and $\overline{Q}$ are also connected to PG 1 and PG2, respectively, leading to PU1/PD1/PG1 and PU2/PD2/PG2.

Figure 3B:
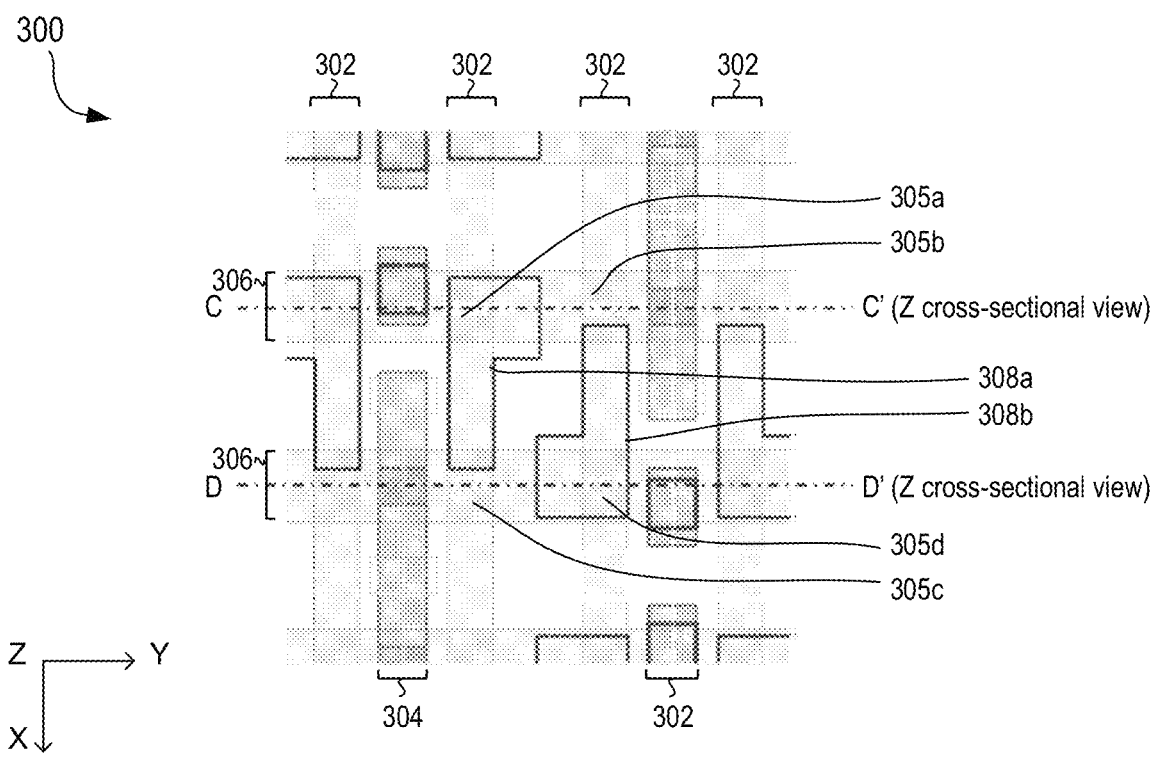
FIG. 3B shows a layout diagram of a top view of a semiconductor device that includes a SRAM bit cell, in accordance with some embodiments of the disclosure.

FIG. 3B shows a simplified layout diagram of a top view of a semiconductor device 300 that includes the SRAM bit cell illustrated in FIG. 3A. The semiconductor device 300 includes gate channels 302 that are parallel to each other. S/D LI channels 304 are disposed between the gate channels 302. Device channels 306 are formed perpendicular to the gate channels 302. As used herein, "device channel" means a track of semiconductor material that includes alternating S/D and gate portions that form the transistor devices. An intersection of the device channels 306 and the gate channels 302 includes one or more gate-all-around (GAA) structures on one or more levels in the Z direction. For example, intersections 305a, 350b, 305c, and 305d can correspond to the GAA structures of PG2, INV2, INV1, and PG1, respectively. The semiconductor device 300 further includes signal and power wiring. For example, wiring structures 308a and 308b correspond to Q and $\overline{Q}$ in FIG. 3A, respectively. As seen in FIG. 3B, the wiring structures 308a and 308b are L shaped structures that each includes a lateral offset conductor that connects a gate channel to an adjacent S/D channel. The structures 308a and 308b form part of the inter-level handshake.

Figure 3C:
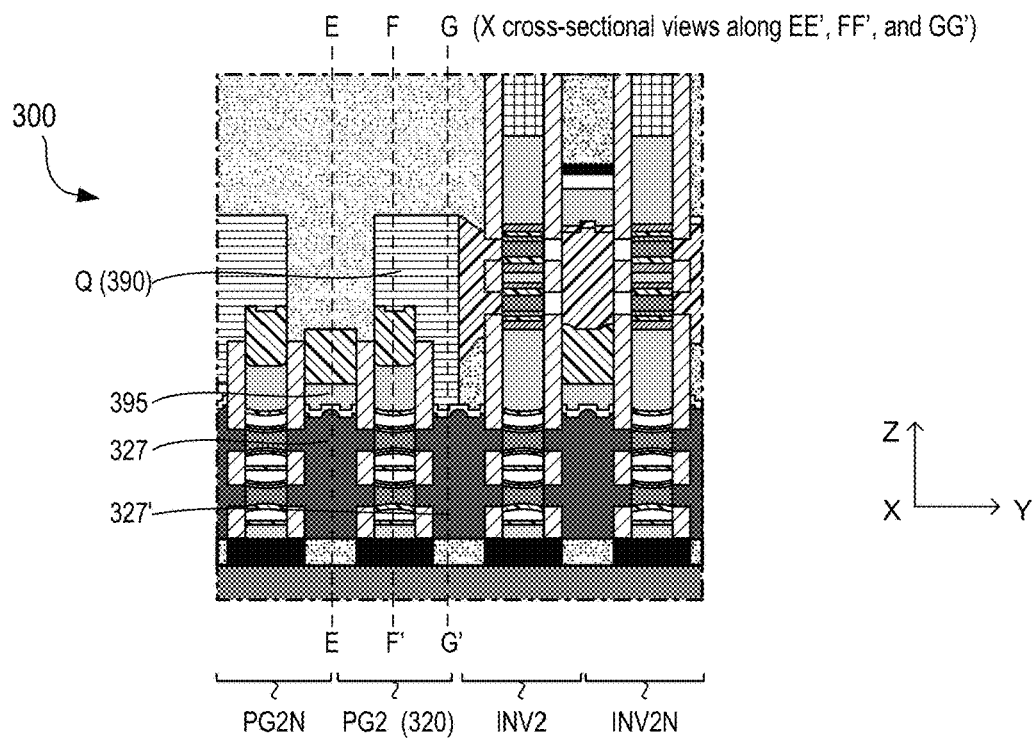
FIGS. 3C and 3D show cross-sectional views taken along line cuts CC' and DD' in FIG. 3B, respectively, in accordance with some embodiments of the disclosure.
Figure 3D:
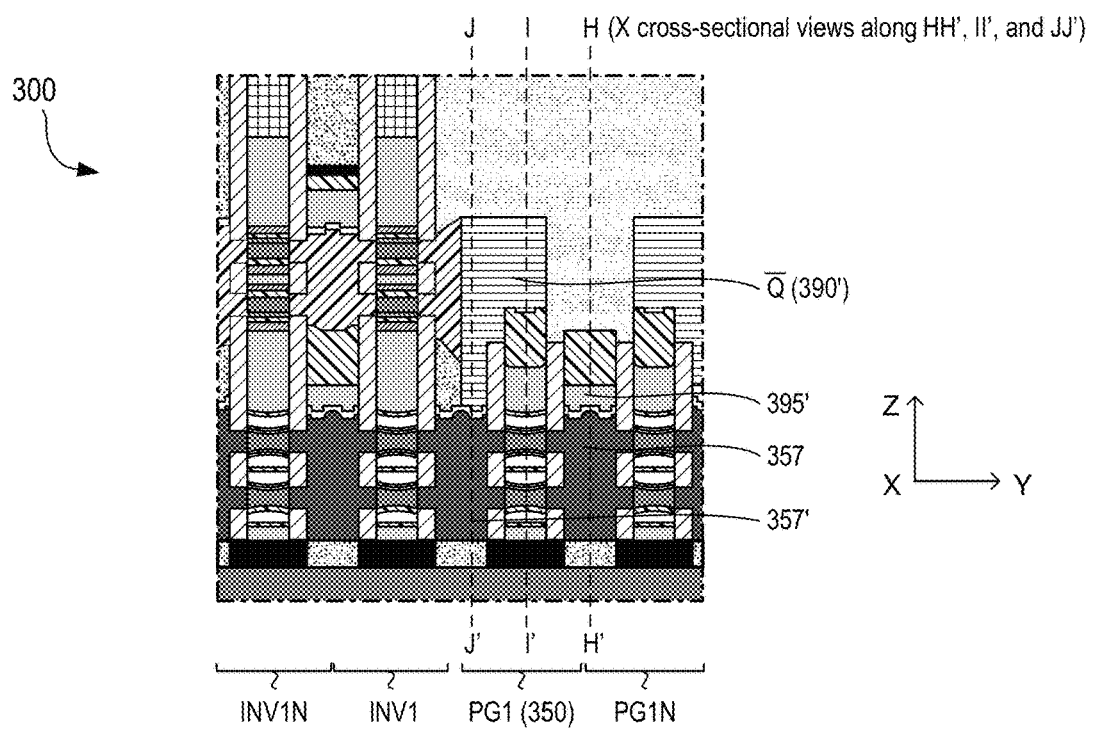

FIGS. 3C and 3D show cross-sectional views taken along line cuts CC' and DD' in FIG. 3B, respectively. As shown, FIG. 3C shows a cross section of PG2 (also noted as 320) and INV2. Specifically, an S/D region 327 of PG2 is connected to a bit line, BL (not shown) via a contact 395. The other S/D region 327' of PG2 is connected to Q (also noted as 390), i.e., an output of INV2. Thus, the structure 390 provides a lateral connection between a gate channel and an adjacent S/D channel. Similarly, FIG. 3D shows a cross section of PG1 (also noted as 350) and INV1. An S/D region 357 of PG1 is connected to another bit line, $\overline{BL}$ (not shown) via another TSV 395'. The other S/D region 357' of PG1 is connected to $\overline{Q}$ (also noted as 390'), i.e., an output of INV1. Thus, the structure 390' provides a lateral connection between a gate channel and an adjacent S/D channel.

FIGS. 3E, 3F, and 3G show cross-sectional views taken along line cuts EE', FF', and GG' in FIG. 3C, respectively. FIG. 3E shows an S/D cross section of PG2 and INV1. The S/D region 327 of PG2 is connected to BL (not shown) via the contact 395. An S/D region 317 of PU1 is connected to a buried power rail (BPR) 391 for $V_{dd}$ while an S/D region of PD1 is connected to another BPR 393 for $V_{ss}$.

FIG. 3F shows a gate/channel cross section of PG2 and INV1. Channels (e.g., 313, 323, and 333) of respective transistors (e.g., 310, 320, and 330) are all surrounded by respective gates (e.g., 311, 321, and 331). The gates 321 of PG2 are connected to a word line (not shown) via a contact 397. While two channels are shown for each device in the examples of FIG. 3A-3J, any number of channels can be formed in other embodiments. PU1 (noted as 310) is disposed over PD1 (noted as 330) so as to form INV1. Gates 311 of PU1 and gates 331 of PD1 are connected by a conductive metal material 305 so that PU1 and PU2 effectively share a common gate that is connected to Q (noted as 390). In some embodiments, Q includes an inter-level structure (e.g., 270).

FIG. 3G shows the other S/D cross section of PG2 and INV1. As shown, Q is connected to another S/D region 327' of PG2. Therefore, the gates 311 and 331 of INV1 are connected to the S/D region 327' by Q. As has been mentioned before, Q is the output of INV2. That is, the input of INV1 is connected to the output of INV2. Thus, the structure 390 in FIG. 3F and 390 in FIG. 3G together form a lateral connection between a gate channel and adjacent S/D channel.

In addition, an insulating material 303 separates the gates 311 and 331 of INV1 from the gates 321 of PG2. The insulating material 303 also separates INV1 from a neighboring CFET (noted as INV1N) of a neighboring cell. PG2 shares the word line with a neighboring NMOS (noted as PG2N) of another neighboring cell. Typically, hundreds of millions of bit cells are used together to form SRAM memory arrays.

FIGS. 3H, 3I, and 3J show cross-sectional views taken along line cuts HH', II', and JJ' in FIG. 3D, respectively. In some embodiments, FIGS. 3H, 3I, and 3J are mirrored images of FIGS. 3E, 3F, and 3G, respectively. For example, FIG. 3E shows the S/D cross section of PG2 and INV1 while FIG. 3H shows an S/D cross section of PG1 (noted as 350) and INV2 which includes PU2 (noted as 340) over PD2 (noted as 360). FIG. 3F shows the gate/channel cross section of PG2 and INV1 while FIG. 3I shows a gate/channel cross section of PG1 and INV2. FIG. 3G shows the other S/D cross section of PG2 and INV1 while FIG. 3J shows the other S/D cross section of PG1 and INV2. Ergo, detailed descriptions of FIGS. 3H-3J will be omitted here for simplicity. Note that gates 341 and 361 of INV2 are connected to an S/D region 357' of PG1 by $\overline{Q}$, the output of INV1. That is, the input of INV2 is connected to the output of INV1. Thus, the structure 390' in FIG. 3H and 390' in FIG. 3I together form a lateral connection between a gate channel and adjacent S/D channel.

FIGS. 3A-3J illustrate an embodiment where the inter-level handshake (e.g., the second inter-level connection 270) repurposes elements of the SRAM bit cell's cross couple (e.g., Q and $\overline{Q}$) to provide a lateral extension to the source/drain local interconnect. Note that alternative flows are contemplated herein and this illustration is exemplary. Accordingly, 3D devices are provided herein to form a very dense and highly efficient connection from a source/drain signal on one level of a stacked CFET technology to the gate of the other level.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
   a first device plane over a substrate, the first device plane including a first transistor device having a first source/drain (S/D) region formed in an S/D channel;
   a second device plane over the first device plane, the second device plane including a second transistor device having a second gate formed in a gate channel which is adjacent to the S/D channel; and
   a first inter-level connection from the first S/D region of the first transistor device to the second gate of the second transistor device, wherein the first inter-level connection includes a lateral offset from the S/D channel to the gate channel, wherein
   the first inter-level connection comprises the S/D channel, a horizontal portion that contacts the S/D channel, and a vertical portion that connects the horizontal portion to the second gate, and
   the vertical portion extends from the first device plane to the second device plane and corresponds to a vertical distance from the first S/D region to the second gate relative to a surface of the substrate.

2. The semiconductor device of claim 1, wherein the horizontal portion corresponds to the lateral offset.

3. The semiconductor device of claim 1, wherein the first inter-level connection has an L shape in a horizontal cross section parallel to a surface of the substrate.

4. The semiconductor device of claim 1, wherein the first inter-level connection comprises a conductive metal wiring structure.

5. The semiconductor device of claim 1, wherein the first transistor device is configured to provide an input signal to the second transistor device.

6. The semiconductor device of claim 1, further comprising a second inter-level connection that connects a first gate of the first transistor device to a second S/D region in the second device plane.

7. The semiconductor device of claim 2, wherein the second S/D region is part of the second transistor device in the second device plane.

8. The semiconductor device of claim 6, wherein the second S/D region is part of a third transistor device in the second device plane.

9. The semiconductor device of claim 1, wherein the first transistor device and the second transistor device are both complementary field-effect transistors (CFETs).

10. The semiconductor device of claim 1, wherein:
    the first transistor device is an n-type field-effect transistor (FET),
    the second transistor device is a p-type FET, and
    the first device plane further includes another n-type FET so as to form a CFET with the second transistor device.

11. The semiconductor device of claim 1, wherein the vertical portion is in direct contact with the horizontal portion.

12. The semiconductor device of claim 1, wherein the vertical portion is configured to electrically connect the horizontal portion to the second gate.

13. A semiconductor device, comprising:
    a pair of CFETs formed over a substrate, the pair of CFETs including an upper CFET positioned over a lower CFET, each CFET including a p-type FET and an n-type FET positioned over each other resulting in a vertical stack of at least four FETs relative to a surface of the substrate; and
    an inter-level connection from a pair of complementary gates formed in a gate channel of one CFET to an S/D region formed in an S/D channel of the other CFET, wherein the gate channel of one CFET has a lateral offset from the S/D channel of the other CFET in a horizontal direction along the surface of the substrate and a vertical distance from the S/D channel of the other CFET in a vertical direction relative to the surface of the substrate.

14. The semiconductor device of claim 13, wherein the inter-level connection comprises:
    the S/D channel;
    a horizontal portion that is connected to the S/D channel and corresponds to the lateral offset, and
    a vertical portion that connects the horizontal portion to the gate channel and corresponds to the vertical distance.

15. The semiconductor device of claim 13, wherein a gate occupies a respective channel being recessed.

16. The semiconductor device of claim 13, wherein the inter-level connection is formed from an upper pair of complementary gates of the upper CFET to a lower S/D region of the lower CFET, the semiconductor device further comprising a self-aligned contact that connects the upper pair of complementary gates to one or more structures positioned below the upper pair of complementary gates.

* * * * *